(12) United States Patent
Nishii et al.

(10) Patent No.: US 9,202,936 B2
(45) Date of Patent: Dec. 1, 2015

(54) SEMICONDUCTOR DEVICE

(71) Applicant: Mitsubishi Electric Corporation, Chiyoda-ku (JP)

(72) Inventors: Akito Nishii, Tokyo (JP); Katsumi Nakamura, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/336,800

(22) Filed: Jul. 21, 2014

(65) Prior Publication Data
US 2014/0327072 A1    Nov. 6, 2014

Related U.S. Application Data

(62) Division of application No. 13/237,309, filed on Sep. 20, 2011, now abandoned.

(30) Foreign Application Priority Data

Mar. 9, 2011   (JP) .................................. 2011-050995

(51) Int. Cl.
*H01L 21/329*   (2006.01)
*H01L 29/861*   (2006.01)
*H01L 29/06*    (2006.01)
(Continued)

(52) U.S. Cl.
CPC .......... *H01L 29/861* (2013.01); *H01L 29/0615* (2013.01); *H01L 29/0696* (2013.01); *H01L 29/083* (2013.01); *H01L 29/423* (2013.01); *H01L 29/66348* (2013.01); *H01L 29/7397* (2013.01)

(58) Field of Classification Search
CPC ............ H01L 29/0615; H01L 29/0696; H01L 29/66348; H01L 29/7397; H01L 29/861
USPC ................. 257/144, 152, 288, 330, 452, 481, 257/E28.01, E29.036, E29.037, E29.115, 257/E31.084, 121, 367, 480, 594
See application file for complete search history.

(56) References Cited

U.S. PATENT DOCUMENTS 5,859,446 A      1/1999   Nagasu et al.
5,969,400 A *   10/1999   Shinohe et al. ............... 257/492
(Continued)

FOREIGN PATENT DOCUMENTS

CN           1819260 A        8/2006
CN         101587912 A       11/2009
(Continued)

OTHER PUBLICATIONS

Combined Office Action and Search Report issued Oct. 14, 2014 in Chinese Patent Application No. 201210071923.7 (with partial English translation).

(Continued)

*Primary Examiner* — Yosef Gebreyesus
(74) *Attorney, Agent, or Firm* — Oblon, McClelland, Maier & Neustadt, L.L.P.

(57) ABSTRACT

A semiconductor device includes: an N-type drift layer; a P-type anode layer on the N-type drift layer; a trench penetrating the P-type anode layer; a conductive substance embedded in the trench via an insulating film; and an N-type buffer layer between the N-type drift layer and the P-type anode layer and having impurity concentration which is higher than that of the N-type drift layer.

3 Claims, 18 Drawing Sheets

(51) Int. Cl.
  *H01L 29/08* (2006.01)
  *H01L 29/423* (2006.01)
  *H01L 29/66* (2006.01)
  *H01L 29/739* (2006.01)

(56) References Cited

U.S. PATENT DOCUMENTS

| | | | |
|---|---|---|---|
| 6,177,713 B1 | 1/2001 | Aono et al. | |
| 2006/0214221 A1* | 9/2006 | Challa et al. | 257/328 |
| 2009/0283776 A1* | 11/2009 | Iwamuro | 257/76 |
| 2010/0308446 A1 | 12/2010 | Nakamura | |
| 2012/0032313 A1* | 2/2012 | Yamamoto et al. | 257/657 |
| 2012/0313212 A1* | 12/2012 | Sugawara | 257/471 |

FOREIGN PATENT DOCUMENTS

| | | |
|---|---|---|
| CN | 101908558 A | 12/2010 |
| DE | 10 2010 028 978 A1 | 12/2010 |
| JP | 8-316501 | 11/1996 |
| JP | 9-232597 | 9/1997 |
| JP | 10-93113 | 4/1998 |
| JP | 11-97715 | 4/1999 |
| JP | 2000-299476 | 10/2000 |
| JP | 2000-323488 | 11/2000 |
| JP | 2001-36069 | 2/2001 |
| JP | 2004-519100 A | 6/2004 |
| JP | 2008-263217 | 10/2008 |
| JP | 2010-283132 A | 12/2010 |
| KR | 10-2010-0130944 A | 12/2010 |

OTHER PUBLICATIONS

Office Action issued Mar. 28, 2013 in Korean Patent Application No. 10-2012-0022160 with Partial English translation.
Office Action issued Feb. 28, 2014 in German Patent Application No. 10 2011 089 452.7 (with English translation).
Office Action issued Jun. 10, 2014 in Japanese Patent Application No. 2011-050995 (with partial English language translation).
Combined Chinese Office Action and Search Report issued Apr. 11, 2014 in Patent Application No. 201210071923.7 (with partial English translation of the Office Action and English translation of categories of cited documents).
Office Action issued Jan. 13, 2015 in Japanese Patent Application No. 2011-050995 (with partial English language translation).

* cited by examiner

| S | 0.701 cm² |
|---|---|
| Vcc | 3600V |
| Ic(Jc) | 0.07A(0.1A/cm²) |
| $V_G$ | −10～+10V |
| PULSE START-UP TIME $t_G$ | 6μs |
| $R_{G1}$ | 100mΩ |
| $R_{G2}$ | 1kΩ |
| $L_S$ | 2.0μH |
| $L_{ak}$ | 0.3nH |
| $R_{ak}$ | 50μΩ |
| $R_L$ | 10MΩ |
| $L_{CE}$ | 2.0nH |
| $R_{CE}$ | 50μΩ |

| S | 0.25cm² |
|---|---|
| Vcc | 1000V |
| Ic(Jc) | 100A (400A/cm²) |
| V$_G$ | -10~+10V |
| PULSE START-UP TIME t$_G$ | 0.1μs |
| R$_G$ | 100mΩ |
| Lm | 2.0μH |
| Lak | 14nH |
| Rak | 2mΩ |
| R$_L$ | 10MΩ |
| L$_{CE}$ | 25nH |
| R$_{CE}$ | 2mΩ |

# SEMICONDUCTOR DEVICE

CROSS-REFERENCE TO RELATED APPLICATIONS

The present application is a divisional of application Ser. No. 13/237,309, filed on Sep. 20, 2011, which claims priority to Japanese Patent Application No. 2011-050995, filed on Mar. 9, 2011, the entire contents of which is incorporated herein by reference in its entirety.

BACKGROUND OF THE INVENTION

1. Field of the Invention

The present invention relates to a diode, which is one of semiconductor devices making up a high withstand voltage power module of 600 V or higher, and more particularly, to a semiconductor device capable of improving oscillation resistance or recovery resistance and suppressing a snap-off phenomenon, and a method for manufacturing the same.

2. Background Art

FIG. 30 is a diagram illustrating a relationship between an ON voltage VF and a recovery loss Erec of a diode. There is a trade-off relationship between the two. Arbitrary points on the trade-off curve are used depending on the product applied. To obtain a diode having characteristics at arbitrary points on the trade-off curve, lifetime has been conventionally controlled by controlling impurity concentration of a P-type anode layer or through electron beam radiation.

When a reverse bias is applied to a diode, a depletion layer extends toward both sides of the anode and cathode. When the impurity concentration of the P-type anode layer is lowered, the depletion layer is likely to extend toward the anode side when a high voltage is applied thereto, which causes a reach-through of the electric field on the anode side, resulting in a problem of leading to a drop in the withstand voltage. However, lowering the impurity concentration of the P-type anode layer makes it possible to reduce a reverse recovery current Irr during recovery operation and thereby reduce recovery loss. Thus, to reduce Irr, the impurity concentration of the P-type anode layer is conventionally reduced within a range in which the withstand voltage can be maintained and the lifetime is controlled to obtain arbitrary characteristics on the trade-off curve. Furthermore, a diode with a trench formed on the anode side has been proposed so far for the purpose of realizing low leakage current and low Irr (e.g., see Japanese Patent Laid-Open No. 11-97715).

SUMMARY OF THE INVENTION

Since the prior art controls VF-Erec trade-off characteristics through the lifetime control technique, a cross point drastically changes, resulting in a problem that it is difficult to perform control during parallel operation. Furthermore, although it is desirable to lower impurity concentration of the P-type anode layer to reduce Irr, there is a problem that the concentration cannot be reduced from the standpoint of maintaining the withstand voltage.

When recovery operation is performed under stringent conditions (high power supply voltage Vcc, low current density Jc and high floating inductance Ls), the carrier density near the cathode drastically changes when the reverse recovery current falls to 0 at the operation termination. When a rate of change of current density djr/dt thereby increases, a snap-off phenomenon occurs in which the anode-cathode voltage jumps beyond a power supply voltage. When a snap-off voltage Vsnap-off at that time exceeds a withstand voltage of the diode, there is a problem that this leads to device destruction. Therefore, the snap-off phenomenon needs to be controlled.

Furthermore, examples of destruction due to recovery operation include voltage destruction and thermal destruction. In one model of thermal destruction, residual carriers in the termination region concentrate on the anode termination section during recovery operation, which causes the temperature at the concentration location to rise and leads to thermal destruction. Therefore, the structure in which carriers concentrate on the anode termination section has a problem that recovery resistance is small.

In view of the above-described problems, a first object of the present invention is to provide a semiconductor device and a method for manufacturing the same which can control ON voltage through the impurity concentration of the P-type anode layer and control ON voltage-recovery loss trade-off characteristics while maintaining the withstand voltage independently of the impurity concentration of the P-type anode layer without controlling lifetime, and suppress snap-off phenomenon.

A second object of the present invention is to provide a semiconductor device which can improve recovery resistance.

According to the first present invention, a semiconductor device includes: an N-type drift layer; a P-type anode layer on the N-type drift layer; a trench penetrating the P-type anode layer; a conductive substance embedded in the trench via an insulating film; and an N-type buffer layer between the N-type drift layer and the P-type anode layer and having impurity concentration which is higher than that of the N-type drift layer.

According to the second present invention, a semiconductor device includes: an N-type drift layer; a P-type anode layer on a part of the N-type drift layer; an anode electrode connected to the P-type anode layer; and an insulating film between an outer end of the P-type anode layer and the anode electrode, wherein a length between the outer end of the P-type anode layer and an inner end of the insulating film is 100 μm or above.

The first present invention makes it possible to control ON voltage through the impurity concentration of the P-type anode layer and control ON voltage-recovery loss trade-off characteristics while maintaining the withstand voltage independently of the impurity concentration of the P-type anode layer without controlling lifetime, and suppress snap-off phenomenon.

The second present invention makes it possible to improve recovery resistance.

Other and further objects, features and advantages of the invention will appear more fully from the following description.

DETAILED DESCRIPTION OF THE PREFERRED EMBODIMENTS

A semiconductor device and a method for manufacturing the same according to the embodiments of the present invention will be described with reference to the drawings. The same components will be denoted by the same symbols, and the repeated description thereof may be omitted.

First Embodiment

Figure 1:
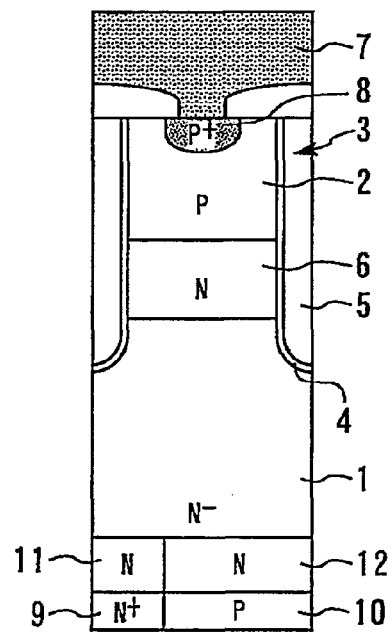
FIG. 1 is a cross-sectional view illustrating a semiconductor device according to a first embodiment of the present invention.

FIG. 1 is a cross-sectional view illustrating a semiconductor device according to a first embodiment of the present invention. A P-type anode layer 2 is provided on an $N^-$-type drift layer 1. A trench 3 is provided so as to penetrate the P-type anode layer. A conductive substance 5 is embedded in the trench 3 via an insulating film 4.

Furthermore, an N-type buffer layer 6 is provided between the $N^-$-type drift layer 1 and the P-type anode layer 2 to reduce a reverse recovery current Irr during recovery operation by suppressing hole injection in an ON state. The N-type buffer layer 6 has impurity concentration, which is lower than that of the P-type anode layer 2 and higher than that of the $N^-$-type drift layer 1.

The conductive substance 5 in the trench 3 is connected to an anode electrode 7 and has the same potential as that of the anode electrode 7. When a reverse bias is applied, this causes the trench 3 to become GND, making it possible to suppress an increase in the electric field in the PN junction between the P-type anode layer 2 and N-type buffer layer 6 through a field plate effect.

Furthermore, to secure ohmic contact with the anode electrode 7, a $P^+$-type contact layer 8 having higher concentration ($\geq 1\times10^{19} cm^{-3}$) than that of the P-type anode layer 2 is provided between the P-type anode layer 2 and the anode electrode 7.

An $N^+$-type cathode layer 9 and a P-type cathode layer 10 are provided on the underside of the $N^-$-type drift layer 1. The P-type cathode layer 10 is designed to have appropriate concentration so as to have desired electric characteristics. Furthermore, N-type layers 11 and 12 are formed right above the $N^+$-type cathode layer 9 and the P-type cathode layer 10 respectively. The N-type layers 11 and 12 can make carrier injection easier when a forward bias is applied, can prevent punch-through when a reverse bias is applied and can control hole injection during recovery operation. The impurity concentration of the respective layers is set to: N-type layer 12≤N-type layer 11<P-type cathode layer 10<$N^-$-type cathode layer 9.

Figure 2:
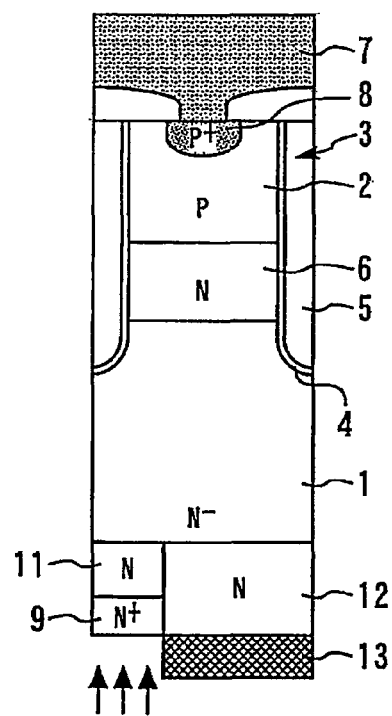
FIGS. 2 and 3 are cross-sectional views illustrating the method of manufacturing the semiconductor device according to the first embodiment of the present invention.
Figure 3:
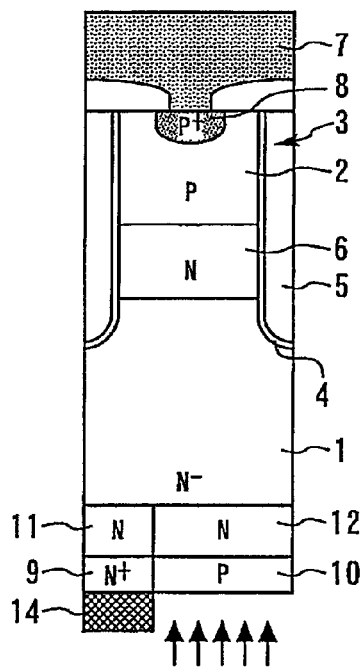

Next, a method of manufacturing the semiconductor device according to the first embodiment of the present invention will be described. FIGS. 2 and 3 are cross-sectional views illustrating the method of manufacturing the semiconductor device according to the first embodiment of the present invention. First, the P-type anode layer 2 or the like is formed on the top surface of the $N^-$-type drift layer 1. Next, as shown in FIG. 2, the $N^+$-type cathode layer 9 is selectively formed in a first region of the underside of the $N^-$-type drift layer 1 using a mask 13. Next, as shown in FIG. 3, the P-type cathode layer 10 is selectively formed in a second region which is different from the first region of the underside of the $N^-$-type drift layer 1 using a mask 14.

Figure 4:
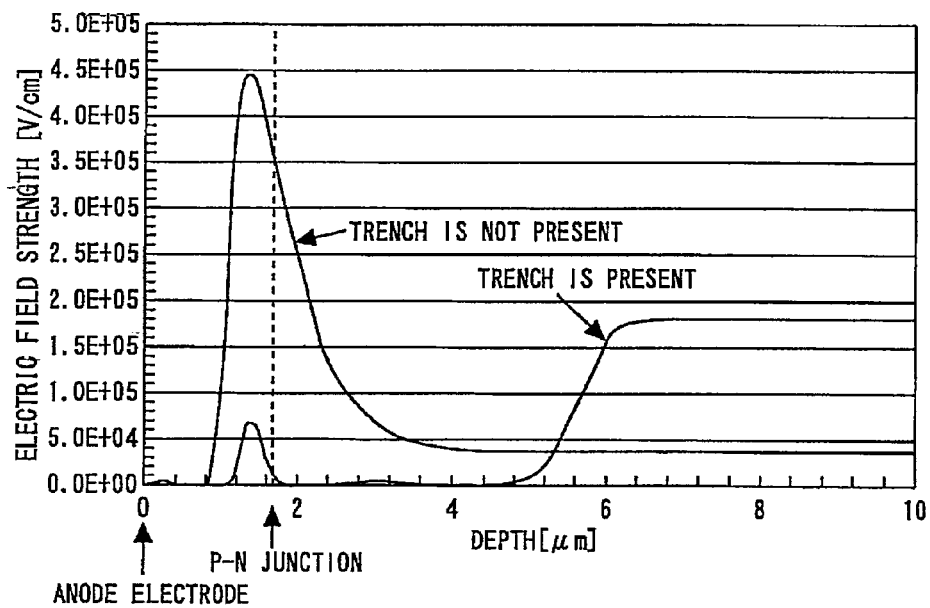
FIG. 4 is a diagram illustrating an electric field strength distribution in the anode section when a trench is present or not.

FIG. 4 is a diagram illustrating an electric field strength distribution in the anode section when a trench is present or not. When the trench 3 is present, the electric field of the PN junction is extended toward the $N^-$-type drift layer 1 side through the field plate effect of the trench 3. This makes it possible to suppress increases in the electric field strength of the PN junction.

Lowering the impurity concentration of the P-type anode layer causes the depletion layer to be more likely to extend toward the P-type anode layer 2 side when a reverse bias is applied and causes the electric field strength of the PN junction to be more likely to increase. Therefore, when the trench 3 is not present, avalanche breakdown takes place in the PN junction at a low voltage, and therefore the withstand voltage is reduced. On the other hand, providing the trench 3 makes it possible to reduce the electric field of the PN junction, and therefore even lowering the impurity concentration of the P-type anode layer 2 can also prevent the withstand voltage from decreasing.

Figure 5:
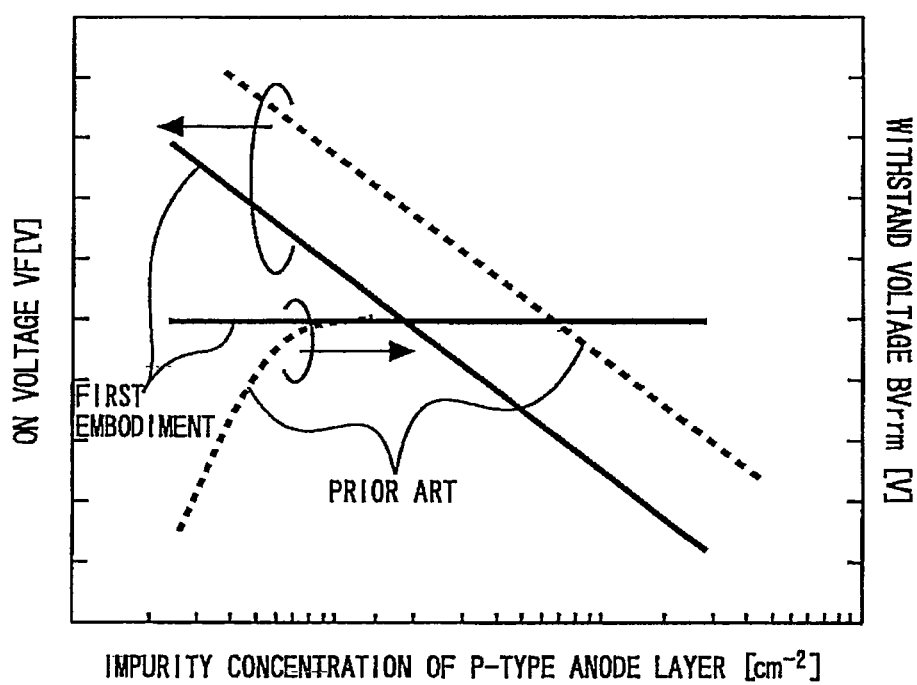
FIG. 5 is a diagram illustrating a relationship between the impurity concentration of the P-type anode layer, ON voltage VF and withstand voltage BVrrm.
Figure 6:
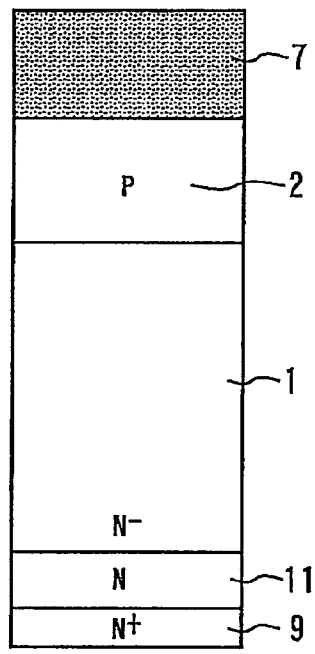
FIG. 6 is a cross-sectional view illustrating a conventional semiconductor device.

FIG. 5 is a diagram illustrating a relationship between the impurity concentration of the P-type anode layer, ON voltage VF and withstand voltage BVrrm. Since the amount of hole injection when a forward bias is applied varies depending on the impurity concentration of the P-type anode layer, the ON voltage changes. When the impurity concentration of the P-type anode layer decreases, the withstand voltage decreases in the conventional structure shown in FIG. 6 as described above, whereas the withstand voltage can be maintained in the structure of the first embodiment.

Figure 7:
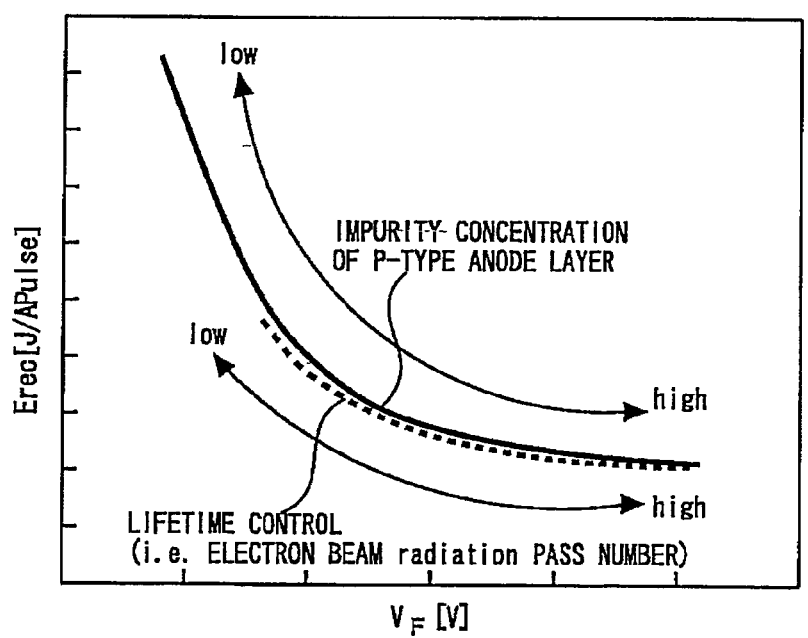
FIG. 7 is a diagram illustrating differences in VF-Erec trade-off characteristics using the respective trade-off control methods of the prior art and the present invention.

FIG. 7 is a diagram illustrating differences in VF-Erec trade-off characteristics using the respective trade-off control methods of the prior art and the present invention. The conventional control method using lifetime control can control trade-off characteristics only in a high VF range determined by the impurity concentration of the P-type anode layer. On the contrary, the control method of the present invention using impurity concentration of the P-type anode layer using the trench structure can maintain the withstand voltage even when the P-type impurity concentration is lowered. For this reason, it is possible to control VF through the impurity concentration of the P-type anode layer and control trade-off characteristics while maintaining the withstand voltage independently of the impurity concentration of the P-type anode layer.

Figure 8:
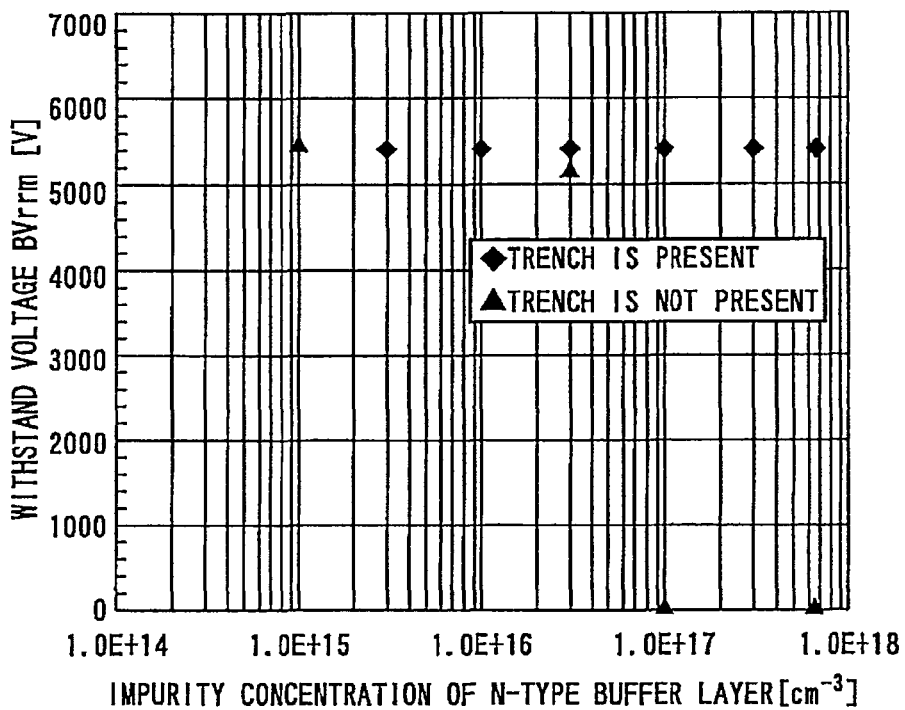
FIG. 8 is a diagram illustrating a relationship between the impurity concentration of the N-type buffer layer and withstand voltage BVrrm when a trench is present or not.

FIG. 8 is a diagram illustrating a relationship between the impurity concentration of the N-type buffer layer and withstand voltage BVrrm when a trench is present or not. When the trench 3 is not present, if the impurity concentration of the N-type buffer layer 6 increases, the electric field of the PN junction is more likely to increase and the withstand voltage decreases. On the other hand, when the trench 3 is present, the increase in the electric field of the PN junction is relaxed, and therefore the withstand voltage is maintained even when the N-type buffer layer 6 is provided. Furthermore, when the impurity concentration of the N-type buffer layer 6 increases, the impurity concentration of the P-type anode layer 2 relatively decreases.

Figure 9:
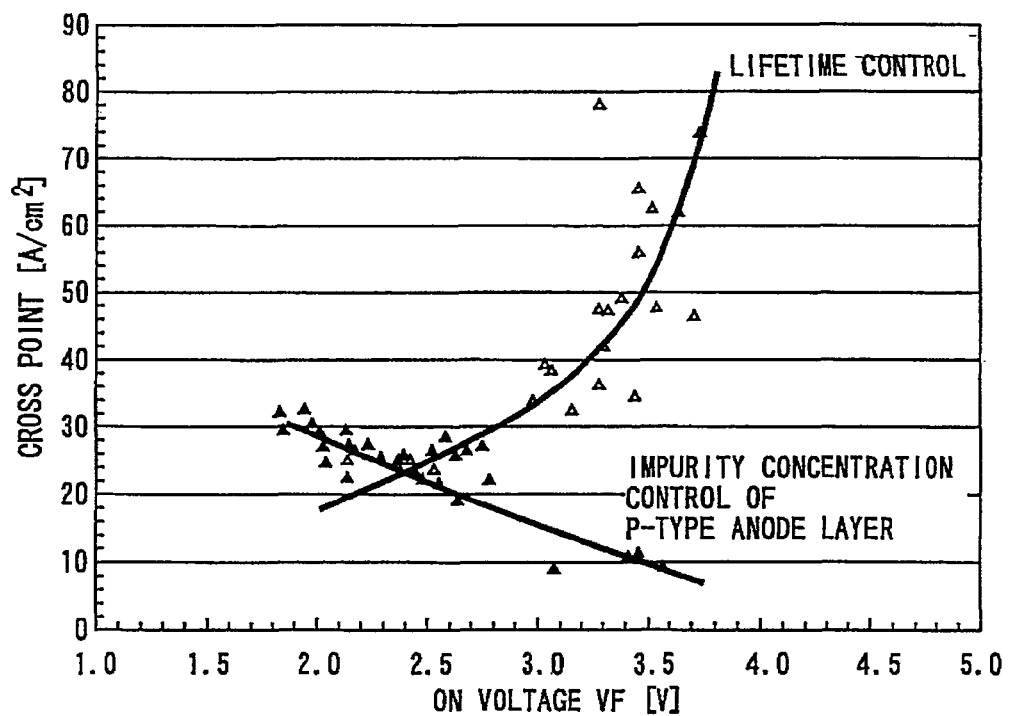
FIG. 9 is a diagram illustrating a relationship between an ON voltage VF and cross points.

FIG. 9 is a diagram illustrating a relationship between an ON voltage VF and cross points. Compared to a case where the ON voltage VF is changed through lifetime control, changing the ON voltage VF through the impurity concentration control of the P-type anode layer 2 can suppress increases of cross points. Here, the chip of a power module mounted with a diode is operated in parallel, and therefore when a chip with cross points having a higher current density than the rated one is mounted, currents are concentrated on the chip and it is more difficult to control the parallel operation. Therefore, the diode of the present embodiment capable of suppressing increases in cross points is effective.

As described above, by providing the trench 3, it is possible to prevent the withstand voltage from decreasing even when the impurity concentration of the P-type anode layer is reduced. This enables VF-Erec trade-off control through the impurity concentration of the P-type anode layer. Thus, lifetime control need not be performed and it is also possible to prevent increases of cross points through lifetime control.

FIG. 10 to FIG. 14 show results of simulating influences of respective design parameters of the anode side on electric characteristics. FIG. 15 is a diagram illustrating the circuit used for the simulations in FIG. 11 and FIG. 13 and the parameters of the circuit.

Figure 10:
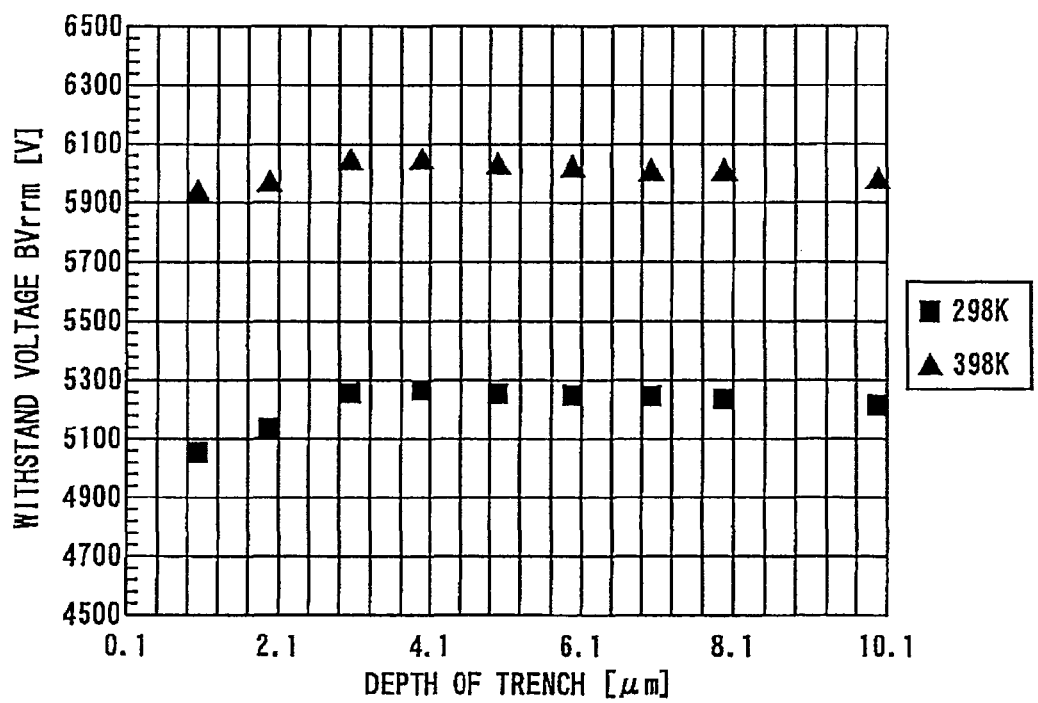
FIG. 10 is a diagram illustrating a relationship between the depth of the trench and the withstand voltage BVrrm.

FIG. 10 is a diagram illustrating a relationship between the depth of the trench and the withstand voltage BVrrm. When the depth of the trench 3 is smaller than the depth (1.66 μm) of the PN junction, the field plate effect of the trench 3 disappears and the withstand voltage decreases. Therefore, the depth of the trench 3 needs to be greater than that of the PN junction.

Figure 11:
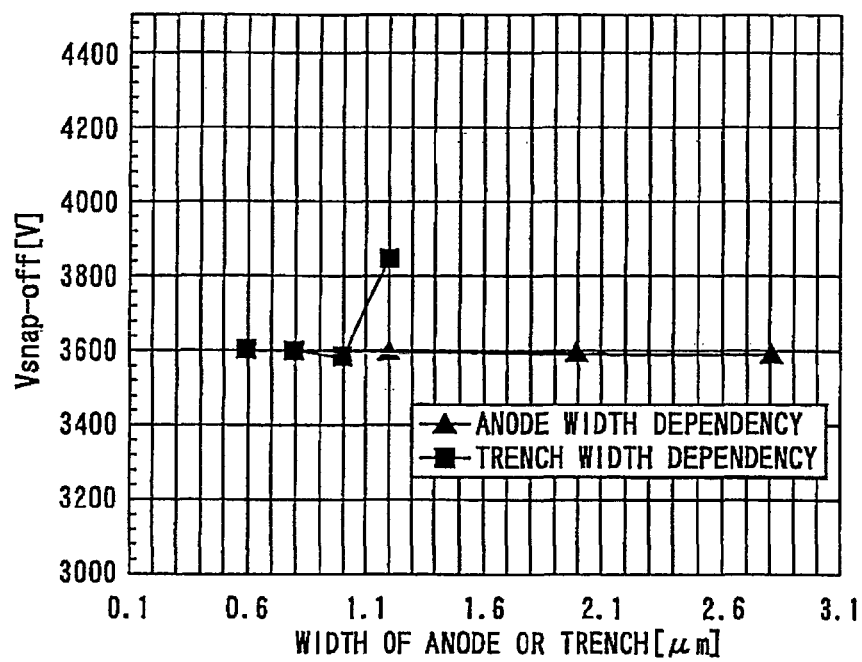
FIG. 11 is a diagram illustrating a relationship between the anode width, trench width and snap-off voltage Vsnap-off.

FIG. 11 is a diagram illustrating a relationship between the anode width, trench width and snap-off voltage Vsnap-off. The anode width is (pitch of the trench 3)−(width of the trench 3 ×2). When the width of the trench 3 is increased while keeping the anode width constant, the contact area of the anode electrode 7 decreases. Therefore, the carrier path is narrowed, and many carriers exist in the trench 3 even upon termination of recovery operation (immediately before the current becomes 0) and the current variation increases compared to a case where the width of the trench 3 is small. The snap-off voltage Vsnap-off increases depending on the rate of change of current, and therefore oscillation characteristics deteriorate. Therefore, the width of the trench 3 needs to be equal to or below 1.2 μm. The anode width has no effect on oscillation characteristics, and therefore the anode width can be designed to an arbitrary value.

Figure 12:
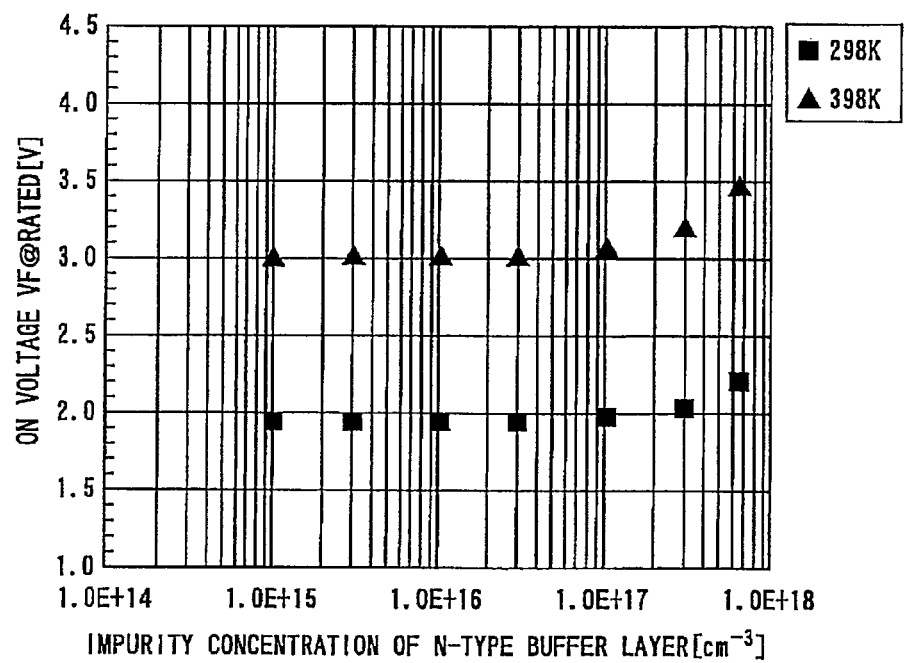
FIG. 12 is a diagram illustrating a relationship between the impurity concentration of the N-type buffer layer 6 and ON voltage VF.
Figure 13:
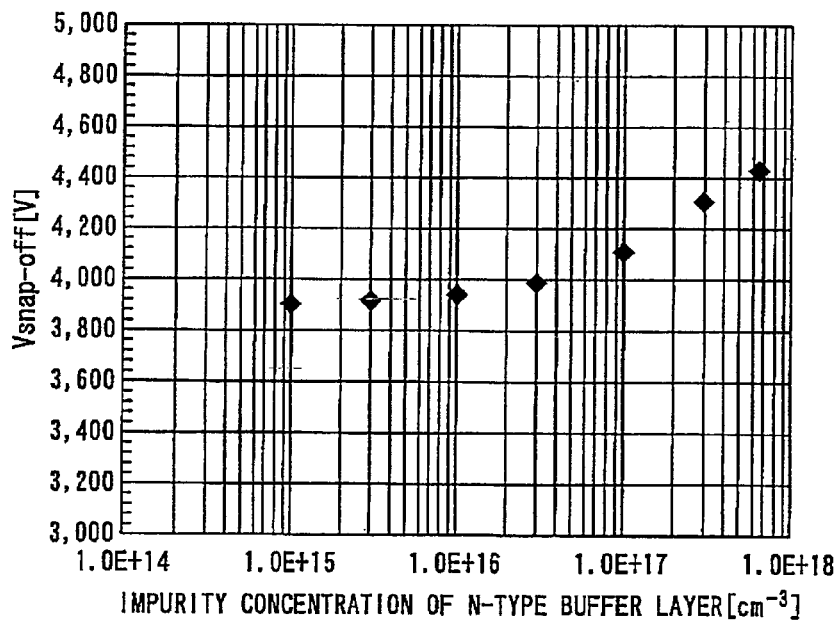
FIG. 13 is a diagram illustrating a relationship between the impurity concentration of the N-type buffer layer 6 and snap-off voltage Vsnap-off.

FIG. 12 is a diagram illustrating a relationship between the impurity concentration of the N-type buffer layer 6 and ON voltage VF. FIG. 13 is a diagram illustrating a relationship between the impurity concentration of the N-type buffer layer 6 and snap-off voltage Vsnap-off. When the impurity concentration of the N-type buffer layer 6 is increased, the ON voltage VF increases and the snap-off voltage Vsnap-off increases. Therefore, the impurity concentration of the N-type buffer layer 6 needs to be equal to or below $1 \times 10^{17}$ cm$^{-3}$. Furthermore, the N-type buffer layer 6 has the effect of controlling recoupling of carriers in the N-type buffer layer 6 and reducing reverse recovery current Irr during recovery operation. The higher the impurity concentration of the N-type buffer layer 6, the greater the effect thereof.

Figure 14:
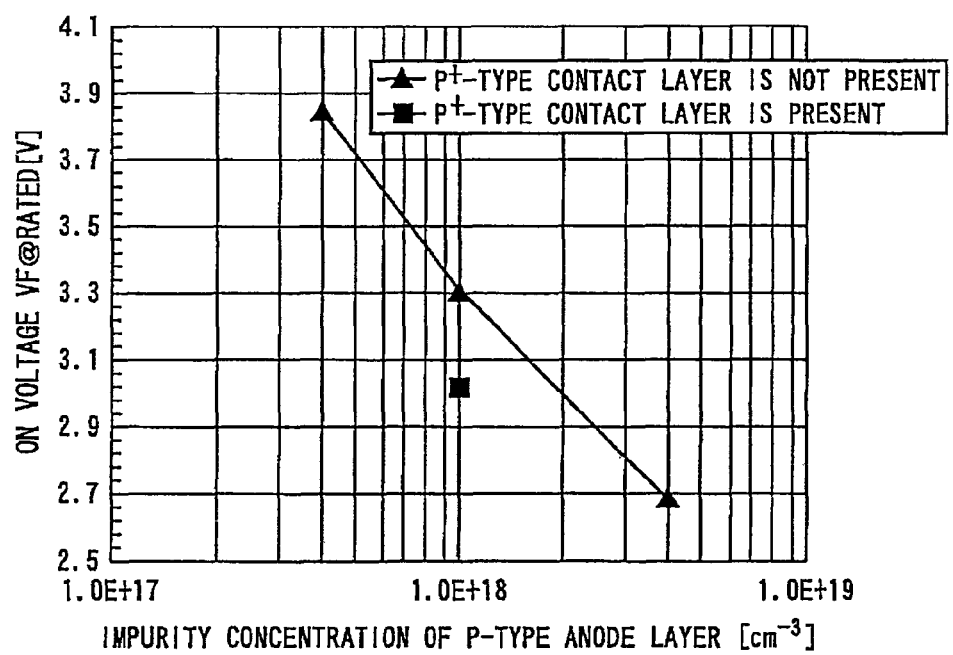
FIG. 14 is a diagram illustrating a relationship between the impurity concentration of the P-type anode layer and ON voltage when the $P^+$-type contact layer 8 is present or not.
Figure 15:
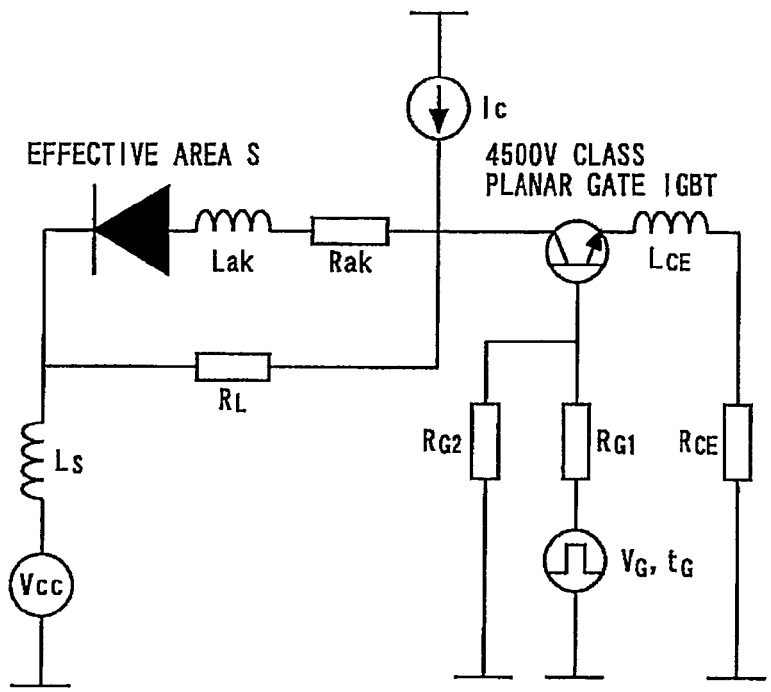
FIG. 15 is a diagram illustrating the circuit used for the simulations in FIG. 11 and FIG. 13 and the parameters of the circuit.

FIG. 14 is a diagram illustrating a relationship between the impurity concentration of the P-type anode layer and ON voltage when the P$^+$-type contact layer 8 is present or not. Since the diode of the present embodiment is provided with the trench 3, the area of contact with the anode electrode 7 is small. Therefore, when the P$^+$-type contact layer 8 is not present, the ON voltage VF increases, and therefore the P$^+$-type contact layer 8 needs to be provided.

Figure 16:
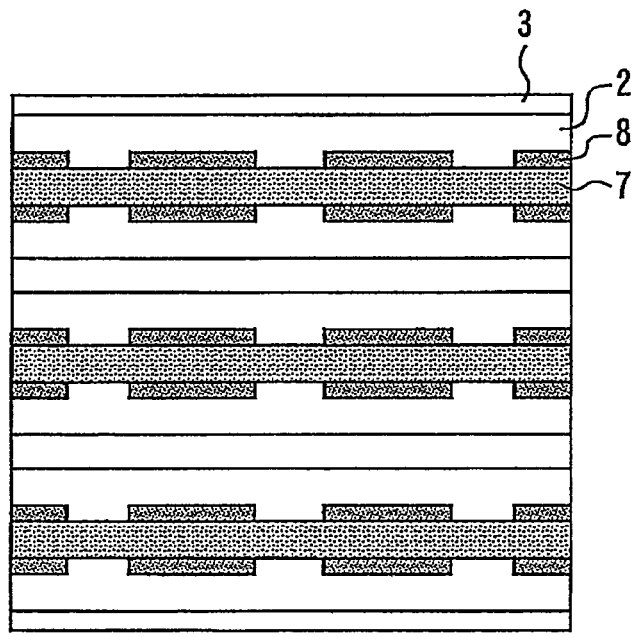
FIG. 16 is a top view illustrating a semiconductor device according to the first embodiment of the present invention.
Figure 17:
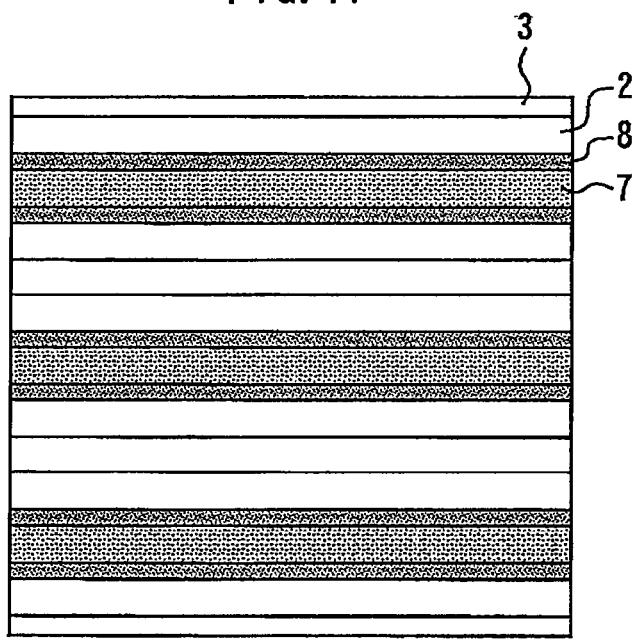
FIG. 17 is a top view illustrating a semiconductor device according to a comparative example 1.

FIG. 16 is a top view illustrating a semiconductor device according to the first embodiment of the present invention. FIG. 17 is a top view illustrating a semiconductor device according to a comparative example 1. As shown in the comparative example 1, when the P$^+$-type contact layer 8 is formed over the entire region of the contact section, hole injection from the anode electrode 7 is determined by the impurity concentration of the P$^+$-type contact layer 8 and it is not possible to control VF-Erec trade-off characteristics through the impurity concentration of the P-type anode layer 2. Therefore, the width of the P$^+$-type contact layer 8 needs to be designed appropriately as in the case of the present embodiment.

Furthermore, the present embodiment provides the P-type cathode layer 10 on the cathode side of the diode. During recovery operation, this causes holes to be injected from the P-type cathode layer 10, suppresses a drastic drop in carrier density of the cathode and can reduce the snap-off voltage Vsnap-off. Therefore, the oscillation resistance can be improved.

Figure 18:
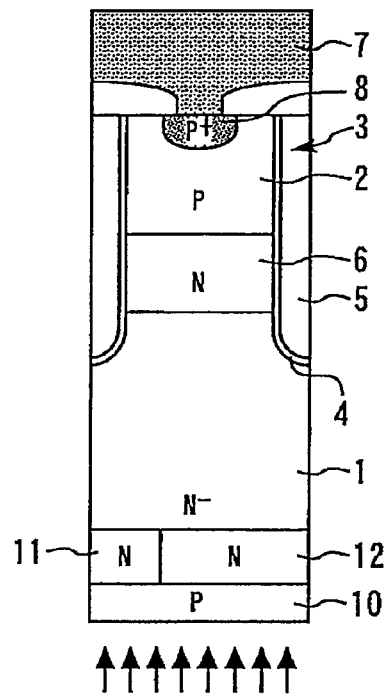
FIGS. 18 and 19 are cross-sectional views illustrating the method of manufacturing a semiconductor device according to the comparative example 2.
Figure 19:
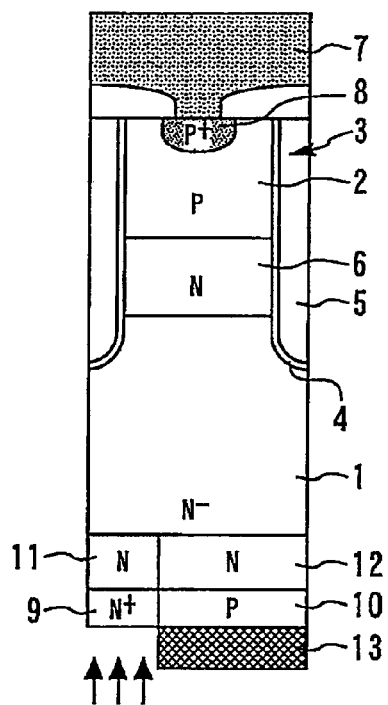

Next, effects of the method of manufacturing a semiconductor device according to the first embodiment of the present invention will be described in comparison with a comparative example 2. FIGS. 18 and 19 are cross-sectional views illustrating the method of manufacturing a semiconductor device according to the comparative example 2. In the comparative example 2, as shown in FIG. 18, the P-type cathode layer 10 is formed on the entire underside of the N⁻-type drift layer 1. Next, as shown in FIG. 19, the N⁺-type cathode layer 9 is selectively formed in a partial region of the underside of the N⁻-type drift layer 1 using the mask 13.

Figure 20:
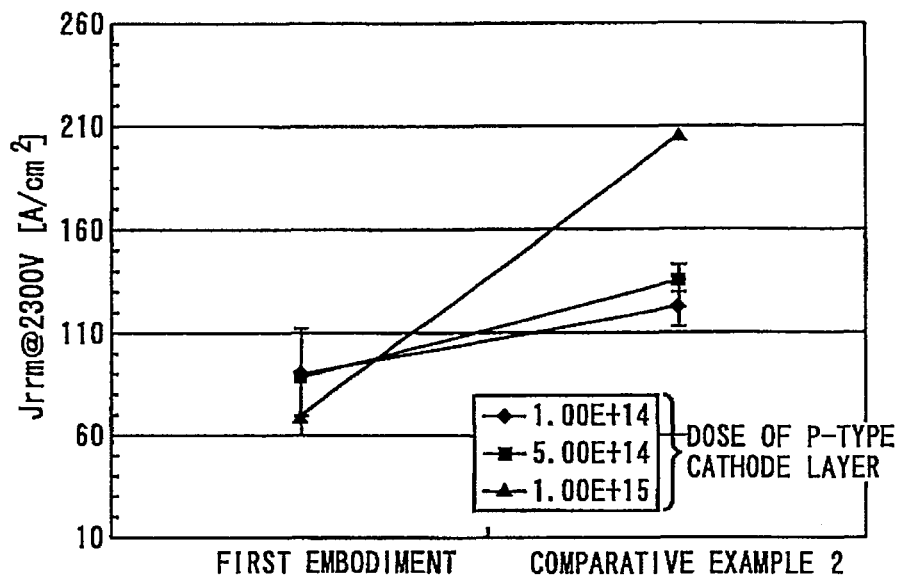
FIG. 20 is a diagram illustrating a leakage current density Jrrm of the diode manufactured using the manufacturing methods according to the first embodiment of the present invention and the comparative example 2.
Figure 21:
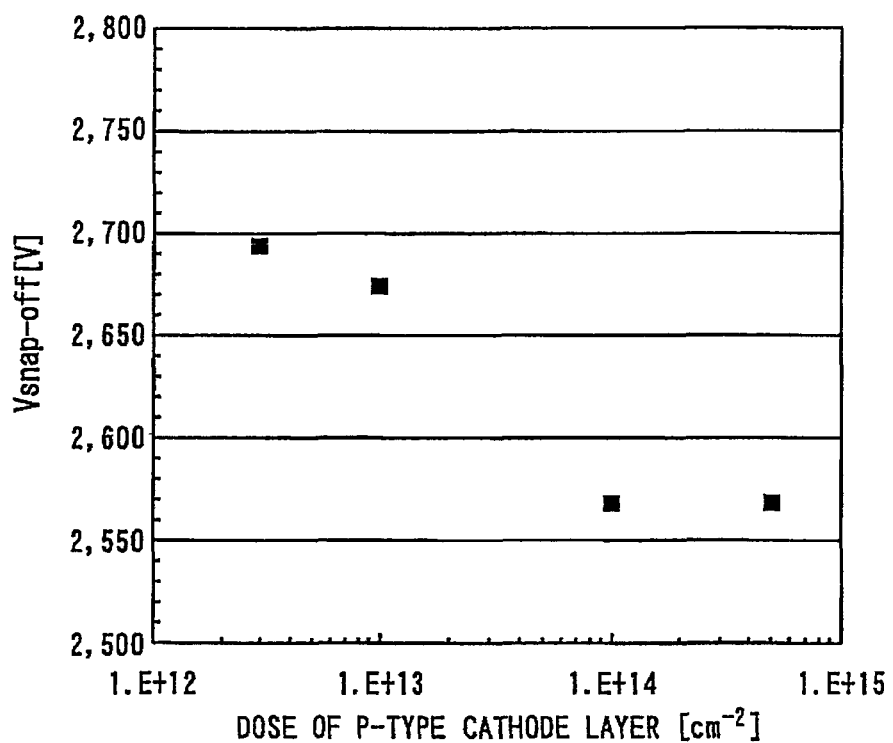
FIG. 21 is a diagram illustrating a relationship between the dose of the P-type cathode layer and the snap-off voltage Vsnap-off.
Figure 22:
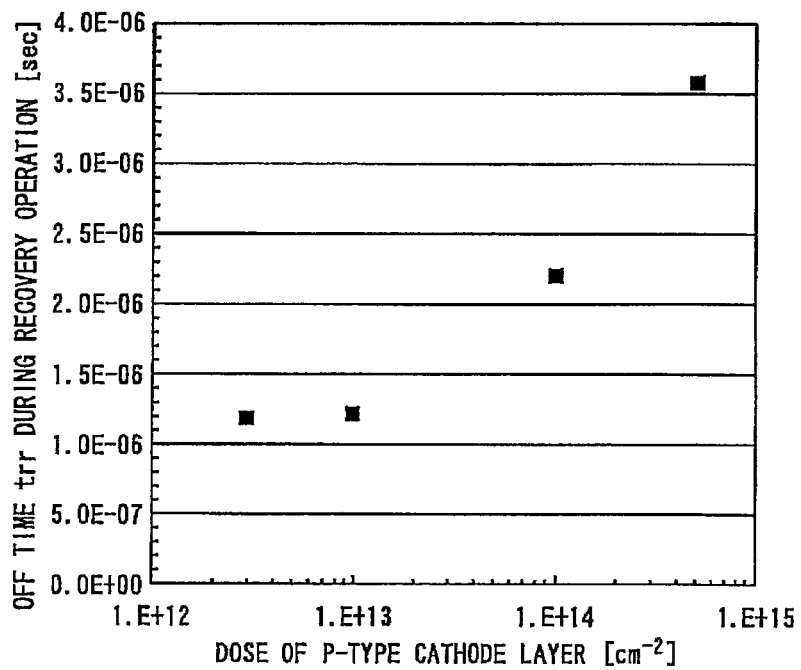
FIG. 22 is a diagram illustrating a relationship between the dose of the P-type cathode layer and OFF time trr during recovery operation.

FIGS. 20 to FIG. 22 show results of measuring a relationship between the formation process of the P-type cathode layer 10, impurity concentration and electric characteristics. Here, measuring conditions in FIG. 21 and FIG. 22 are: power supply voltage Vcc is 2500 V, current density Jc is 0.7×rated current density, floating inductance Ls is 4.6 µH, and the rate of change of current density dj/dt at the time of recovery operation start is 1350 A/µsec·cm$^{-2}$.

FIG. 20 is a diagram illustrating a leakage current density Jrrm of the diode manufactured using the manufacturing methods according to the first embodiment of the present invention and the comparative example 2. In the comparative example 2, the leakage current increases and the withstand voltage decreases. Therefore, it is necessary to selectively form the P-type cathode layer 10 and N⁺-type cathode layer 9 to prevent influences from each other as in the case of the first embodiment.

FIG. 21 is a diagram illustrating a relationship between the dose of the P-type cathode layer and the snap-off voltage Vsnap-off. FIG. 22 is a diagram illustrating a relationship between the dose of the P-type cathode layer and OFF time trr during recovery operation. The higher the dose of the P-type cathode layer 10, the greater the snap-off voltage V snap-off suppression effect. However, if the dose is too high, the OFF time trr during recovery operation becomes longer, which leads to deterioration of recovery resistance. Therefore, the dose of the P-type cathode layer 10 needs to fall within a range of $1\times10^{13}$ to $1\times10^{14}$ cm$^{-3}$.

Figure 23:
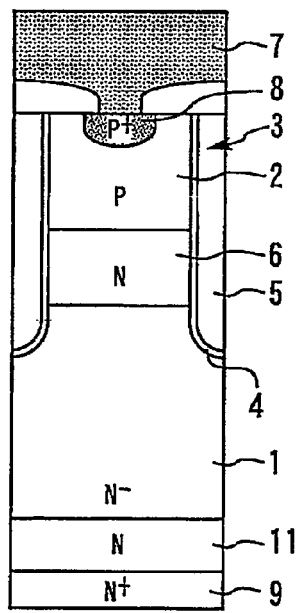
FIG. 23 is a cross-sectional view illustrating a modification example of the semiconductor device according to the first embodiment of the present invention.

FIG. 23 is a cross-sectional view illustrating a modification example of the semiconductor device according to the first embodiment of the present invention. In this way, even when the P-type cathode layer 10 is not provided, effects of the above described trench structure can be obtained.

Figure 24:
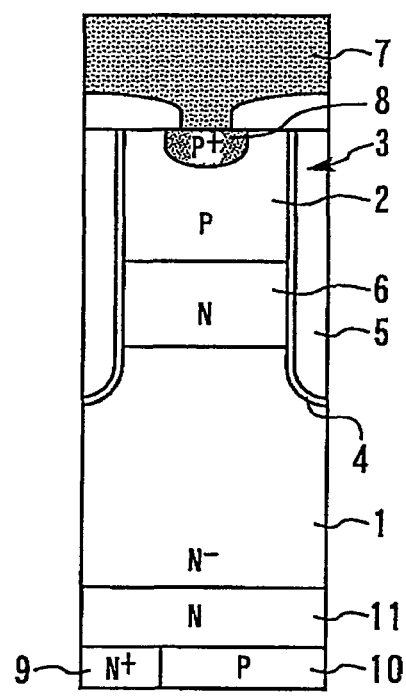
FIG. 24 is a cross-sectional view illustrating a modification example of the semiconductor device according to the first embodiment of the present invention.

FIG. 24 is a cross-sectional view illustrating a modification example of the semiconductor device according to the first embodiment of the present invention. In this way, even when the N buffer layer on the cathode side has uniform concentration, it is possible to obtain an effect of suppressing the snap-off voltage Vsnap-off by the aforementioned P-type cathode layer.

Although a withstand voltage class device of 3300 V class or higher has been described in the present embodiment as an example, similar effects can also be obtained with a withstand voltage class of less than 3300 V.

Second Embodiment

Figure 25:
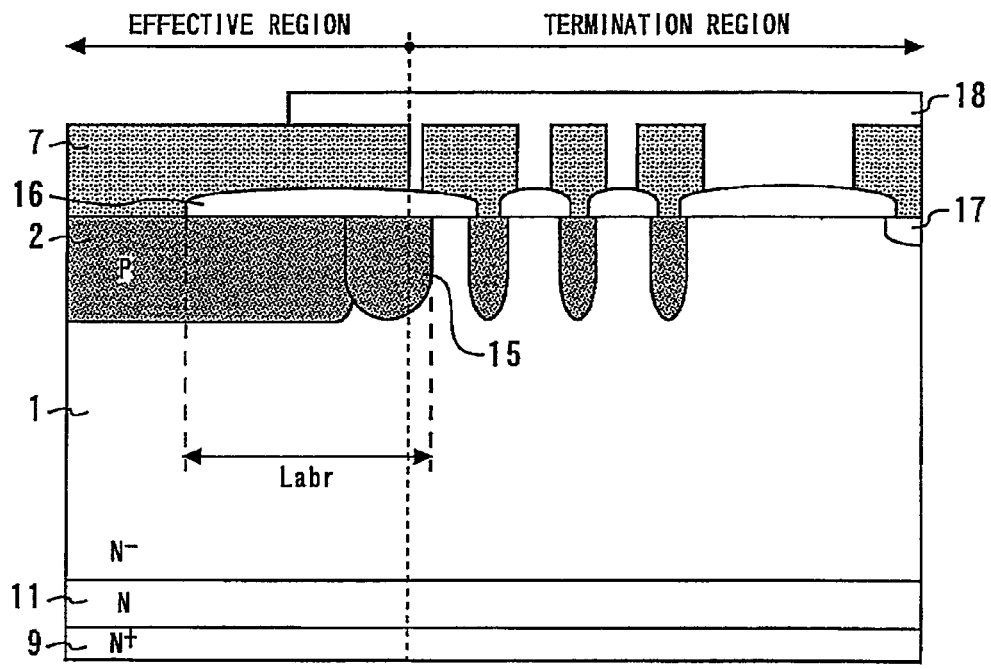
FIG. 25 is a cross-sectional view illustrating a semiconductor device according to a second embodiment of the present invention.

FIG. 25 is a cross-sectional view illustrating a semiconductor device according to a second embodiment of the present invention. A termination region is provided outside an effective region of a diode. P-type anode layers 2 and 15 are provided on a part of an N⁻-type drift layer 1 in the effective region. An anode electrode 7 is connected to the P-type anode layer 2. An insulating film 16 is provided between outer ends of the P-type anode layers 2 and 15 and the anode electrode 7. In the termination region, a channel stopper 17 is provided at an outer end of the N⁻-type drift layer 1. An insulating film 18 is provided in the termination region.

Figure 26:
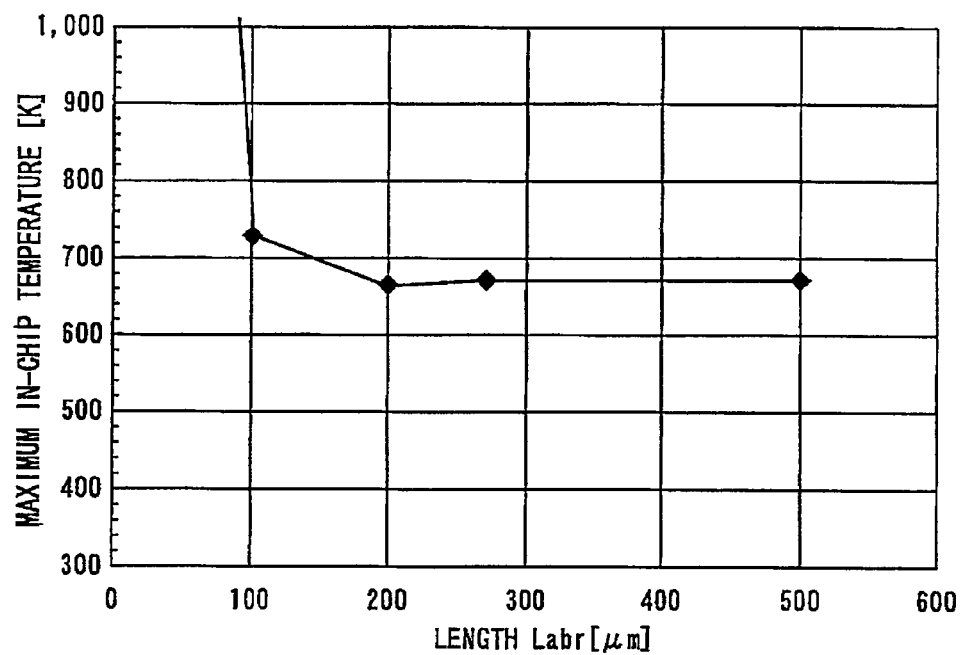
FIG. 26 is a diagram illustrating results of simulating a relationship between a length Labr and a maximum in-chip temperature.
Figure 27:
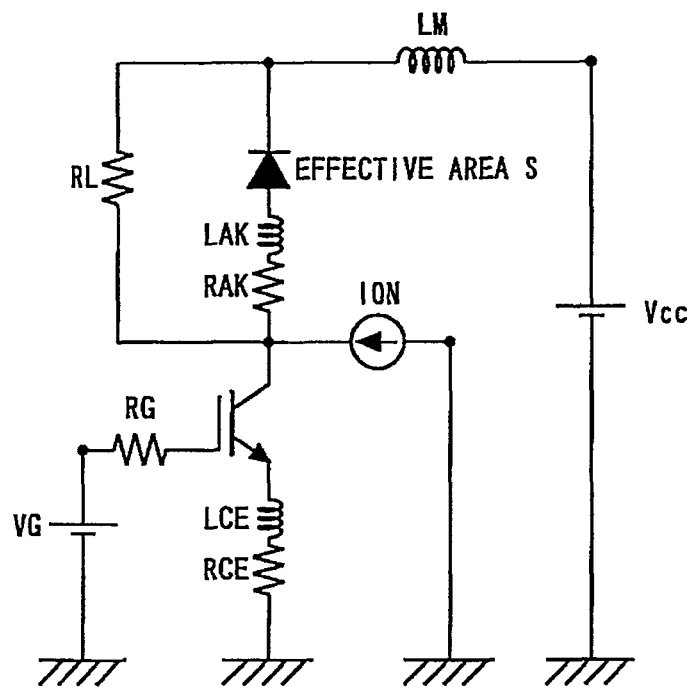
FIG. 27 is a diagram illustrating the circuit used for the simulation in FIG. 26 and parameters of the circuit.

FIG. 26 is a diagram illustrating results of simulating a relationship between a length Labr and a maximum in-chip temperature. FIG. 27 is a diagram illustrating the circuit used for the simulation in FIG. 26 and parameters of the circuit. The length Labr is a length between the outer end of the P-type anode layer 2 and an inner end of the insulating film 16. By extending the insulating film 16 toward the effective region side, a resistance component is formed at an end of the anode effective region.

During recovery operation, residual carriers in the termination region concentrate on the end of the anode effective region and exit to the outside circuit through the contact. In this case, a large current flows, causing a temperature rise. Therefore, when the length Labr is small, the temperature drastically rises within a narrow range and recovery destruction is caused by heat. Therefore, the present embodiment sets the length Labr between the outer end of the P-type anode layer 2 and the inner end of the insulating film 16 to 100 µm or above. This prevents heat from scattering through the resistance component producing a temperature rise.

Figure 28:
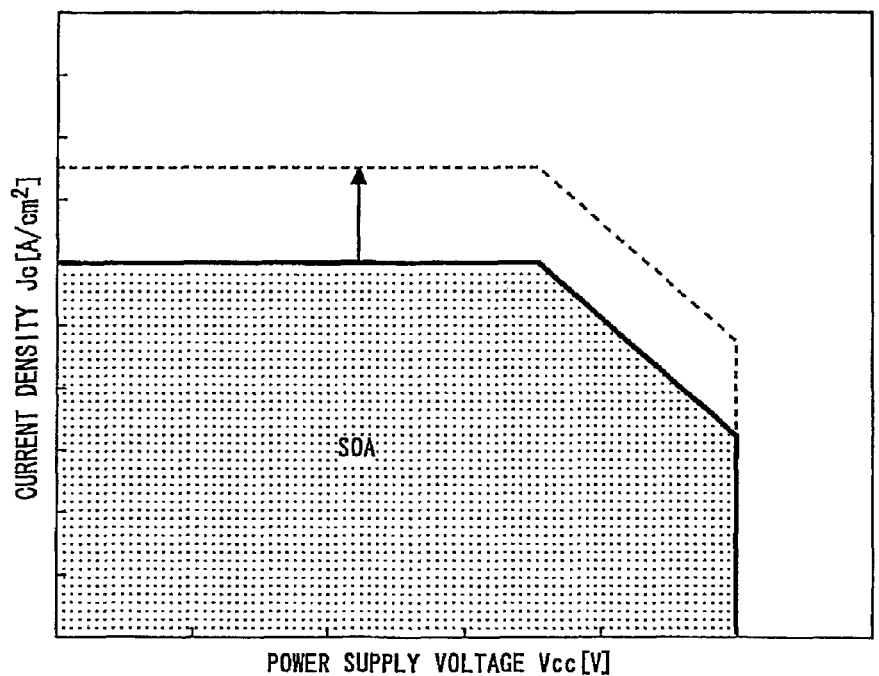
FIG. 28 is a diagram illustrating a recovery SOA (Safety Operation Area) of the diode.

FIG. 28 is a diagram illustrating a recovery SOA (Safety Operation Area) of the diode. The recovery SOA shows a relationship between a power supply voltage Vcc that guarantees operation of the diode and a current density Jc. By providing a resistance component at an end of the anode effective region as in the case of the present embodiment, it is possible to improve the recovery resistance as shown by a broken line in the figure.

Figure 29:
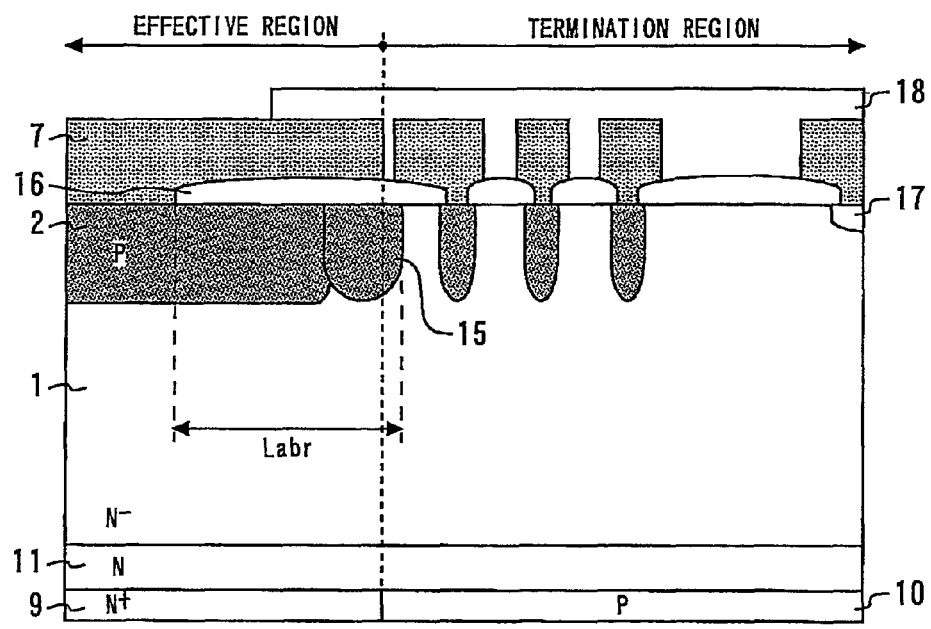
FIG. 29 is a cross-sectional view illustrating a modification example of the semiconductor device according to the second embodiment of the present invention.
Figure 30:
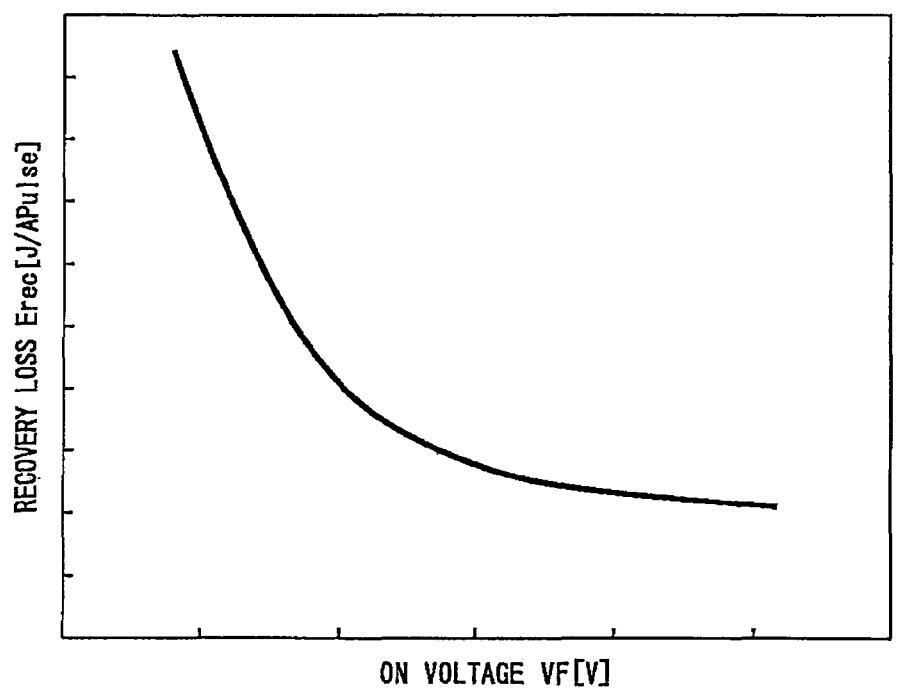
FIG. 30 is a diagram illustrating a relationship between an ON voltage VF and a recovery loss Erec of a diode.

FIG. 29 is a cross-sectional view illustrating a modification example of the semiconductor device according to the second embodiment of the present invention. A P-type cathode layer 10 is provided in the termination region. In this case, effects of the present invention can be obtained, too. Without being limited to this, effects of the present invention can be obtained no matter what structure the anode effective region, cathode effective region or cathode termination region has.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
    an N-type drift layer;
    a P-type anode layer on the N-type drift layer;
    a trench penetrating the P-type anode layer;
    a plurality of P⁺-type contact layers on the P-type anode layer and having impurity concentration which is higher than that of the P-type anode layer;
    a conductive substance embedded in the trench via an insulating film; and
    an N-type buffer layer between the N-type drift layer and the P-type anode layer and having impurity concentration which is higher than that of the N-type drift layer,
    wherein the plurality of P⁺-type contact layers are spaced apart from each other and arranged in a longitudinal direction of the trench as viewed in plan.

2. The semiconductor device according to claim 1, wherein the N-type buffer layer has an impurity concentration which is equal to or below $1\times10^{17}$ cm$^{-3}$.

3. The semiconductor device according to claim 1, wherein the trench has a width which is equal to or below 1.2 µm.

* * * * *